United States Patent
Kidd et al.

(10) Patent No.: US 9,013,851 B2
(45) Date of Patent: Apr. 21, 2015

(54) INRUSH CURRENT CONTROL CIRCUIT AND METHOD FOR UTILIZING SAME

(75) Inventors: David Anthony Kidd, San Jose, CA (US); Ramesh Senthinathan, Cupertino, CA (US)

(73) Assignee: Broadcom Corporation, Irvine, CA (US)

( * ) Notice: Subject to any disclaimer, the term of this patent is extended or adjusted under 35 U.S.C. 154(b) by 621 days.

(21) Appl. No.: 12/660,232

(22) Filed: Feb. 22, 2010

(65) Prior Publication Data

US 2011/0205680 A1    Aug. 25, 2011

(51) Int. Cl.
*H02H 3/08* (2006.01)
*H02H 9/02* (2006.01)
*G06F 1/26* (2006.01)

(52) U.S. Cl.
CPC ........................................ *G06F 1/26* (2013.01)

(58) Field of Classification Search
CPC ........ H02H 9/002; H02H 9/025; H02H 1/043
USPC ...................................... 361/93.9, 93.1, 93.2
See application file for complete search history.

(56) References Cited

U.S. PATENT DOCUMENTS

| | | | |
|---|---|---|---|
| 8,074,086 B1 * | 12/2011 | Sancheti et al. | 713/300 |
| 2006/0214687 A1 * | 9/2006 | Arora et al. | 326/82 |
| 2009/0160253 A1 * | 6/2009 | Rao et al. | 307/38 |

* cited by examiner

*Primary Examiner* — Thienvu Tran
*Assistant Examiner* — Christopher Clark
(74) *Attorney, Agent, or Firm* — Oblon, McClelland, Maier & Neustadt, L.L.P.

(57) ABSTRACT

Disclosed is an inrush current control circuit for controlling current into a high-current circuit block. The inrush current control circuit comprises a number of distributed switches and a digital control circuit coupled to at least one of the distributed switches. The digital control circuit is configured to switch a first group of the distributed switches in response to an enable/disable signal. The digital control circuit is further configured to switch a second group of the distributed switches after a first programmable delay. According to one embodiment, a method comprises switching a first group of distributed switches by a digital control circuit of an inrush current control circuit in response to an enable/disable signal, and switching a second group of the distributed switches by the digital control circuit after a first programmable delay, thereby resulting in regulation of a flow of an inrush current.

20 Claims, 5 Drawing Sheets

INRUSH CURRENT CONTROL CIRCUIT AND METHOD FOR UTILIZING SAME

BACKGROUND OF THE INVENTION

1. Field of the Invention

The present invention is generally in the field of electronic circuits and systems. More specifically, the present invention is in the field of control circuitry.

2. Background Art

High-current circuit blocks, such as microprocessors, may suffer from power dissipation and noise due to high inrush currents. When a high-current circuit block transitions from an inactive state to an active state, for example, a large transient input current (known as an inrush current) can spike as the internal capacitances of the circuit absorb electrical energy. The inrush current may be many times greater than the steady-state current, for example. Inrush currents may adversely affect the robustness and voltage droop of a high-current circuit block. Inrush currents may also dissipate unwanted amounts of power and damage internal circuit components.

Efficiently controlling inrush currents into high-current circuit blocks has presented many problems. For example, external analog control circuits have proven impractical to fabricate and package with high-current circuit blocks. Moreover, conventional control circuits that have implemented sequentially activated switch pairs (sometimes known as mother-daughter configurations) may be too insensitive to adequately mitigate the problems caused by inrush currents.

Accordingly, there is a need to overcome the drawbacks and deficiencies in the art by providing a sensitive and efficient control circuit to control inrush currents that flow into a high-current circuit block. Moreover, the control circuit should be compatible with existing semiconductor manufacturing and packaging technology.

SUMMARY OF THE INVENTION

An inrush current control circuit and method for utilizing same, substantially as shown in and/or described in connection with at least one of the figures, as set forth more completely in the claims.

DETAILED DESCRIPTION OF THE INVENTION

Figure 1:
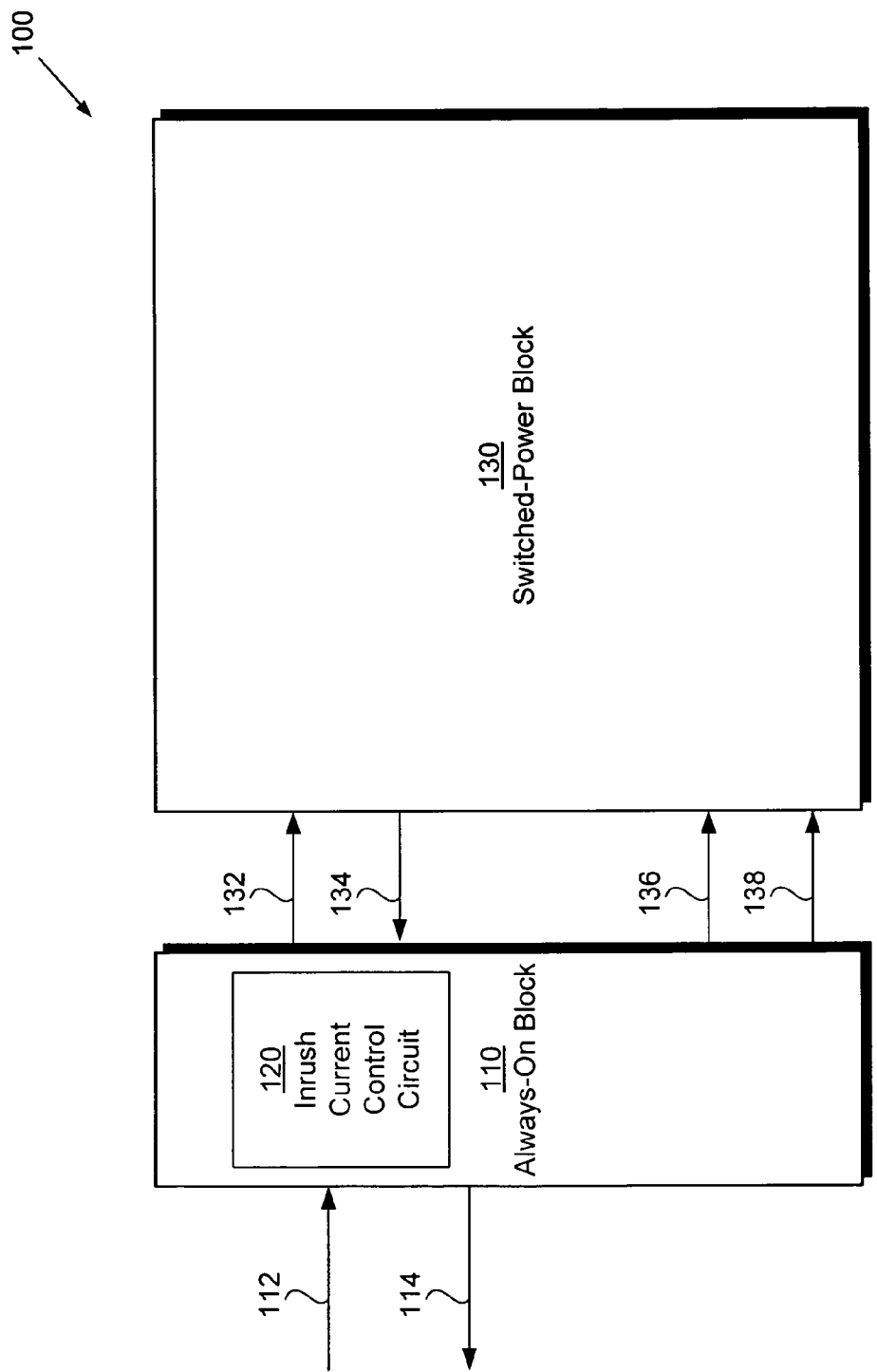
FIG. 1 shows a block diagram of an exemplary control environment suitable for implementation of one embodiment of the present invention.

The present invention is directed to an inrush current control circuit and method for utilizing same. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings. It should be borne in mind that, unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a block diagram of exemplary control environment 100, including an inrush current control circuit, according to one embodiment of the present invention. FIG. 1 provides an overview and elements shown in FIG. 1 conceptually represent physical and electrical elements. As illustrated, control environment 100 may contain always-on block 110 containing control circuitry and switched-power block 130 comprising a high-current circuit block. Always-on block 110 may have block output 114 and block input 112 to and from a test environment, user, or computer system (not shown in FIG. 1).

Always-on block 110 and switched-power block 130 may communicate through clock and reset path 138, power switch enable path 136, level shifted input path 132 and switched-power block output path 134, for example. As illustrated in FIG. 1, always-on block 110 may include inrush current control circuit 120, which implements an exemplary circuit and method to control switched-power block 130.

Figure 2:
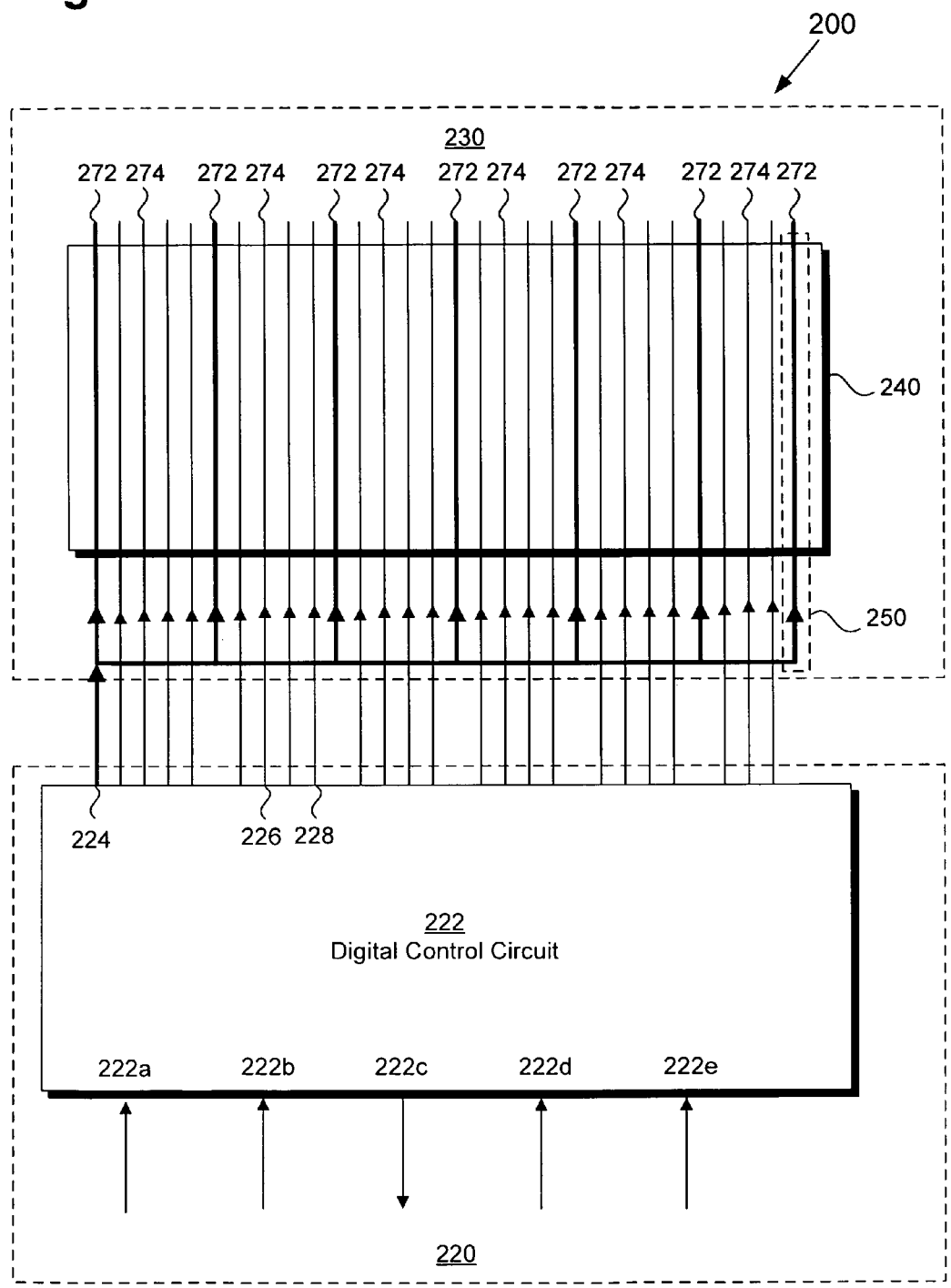
FIG. 2 shows a shows an interface between a switched-power block and an inrush current control circuit in accordance with one embodiment of the present invention.

FIG. 2 shows an exemplary interface between inrush current control circuit 120 and switched-power block 130, in FIG. 1, in greater detail. In FIG. 2, interface 200 contains exemplary signals and system blocks that control switched-power block 230. In this embodiment, inrush current control circuit 220 and switched-power block 230 correspond respectively to inrush current control circuit 120 and switched-power block 130, in FIG. 1. As shown in FIG. 2, switched-power block 230 includes high-current circuit block 240, which was mentioned but not explicitly shown in relation to FIG. 1, while inrush current control circuit 220 includes digital control circuit 222.

Inputs to digital control circuit 222 may include Wake-up signal 222a, Power Down signal 222b, X-Delay signal 222d and Y-Delay signal 222e. Power Ok signal 222c may be output from digital control circuit 222. Digital control circuit 222 may provide control signals such as initial column signal 224, X-column signal 226 and Y-column signal 228. Digital control circuit 222 may incorporate circuitry, firmware or software (not shown in FIG. 2) to selectively route signals to switched-power block 230 according to a desired control method. In some embodiments, digital control circuit 222 may also incorporate isolation cells (not shown in FIG. 2) to prevent crowbar currents from erroneously driving logic circuitry while switched-power block 230 is in an inactive state. In one embodiment, digital control circuit 222 may be connected to a replica circuit, such as a current mirror (not shown in FIG. 2) to deliver an analog voltage to switched-power block 230.

Switched-power block 230 may include a plurality of distributed switched-power cells, including exemplary switched-power cell grouping 250. Individual cells may be grouped into groups of switched-power cells, including major cell group 272 and minor cell group 274. The cell distribution may be uniform or in localized patterns, for example. The distribution may also conform to controlled collapse chip connect ("C4") bump configurations on a semiconductor die or package. Groups of switched-power cells, including major cell group 272 and minor cell group 274, may be laid out in columns, such as switched power cell grouping 250, to optimize control of high-current circuit block 240.

Figure 3:
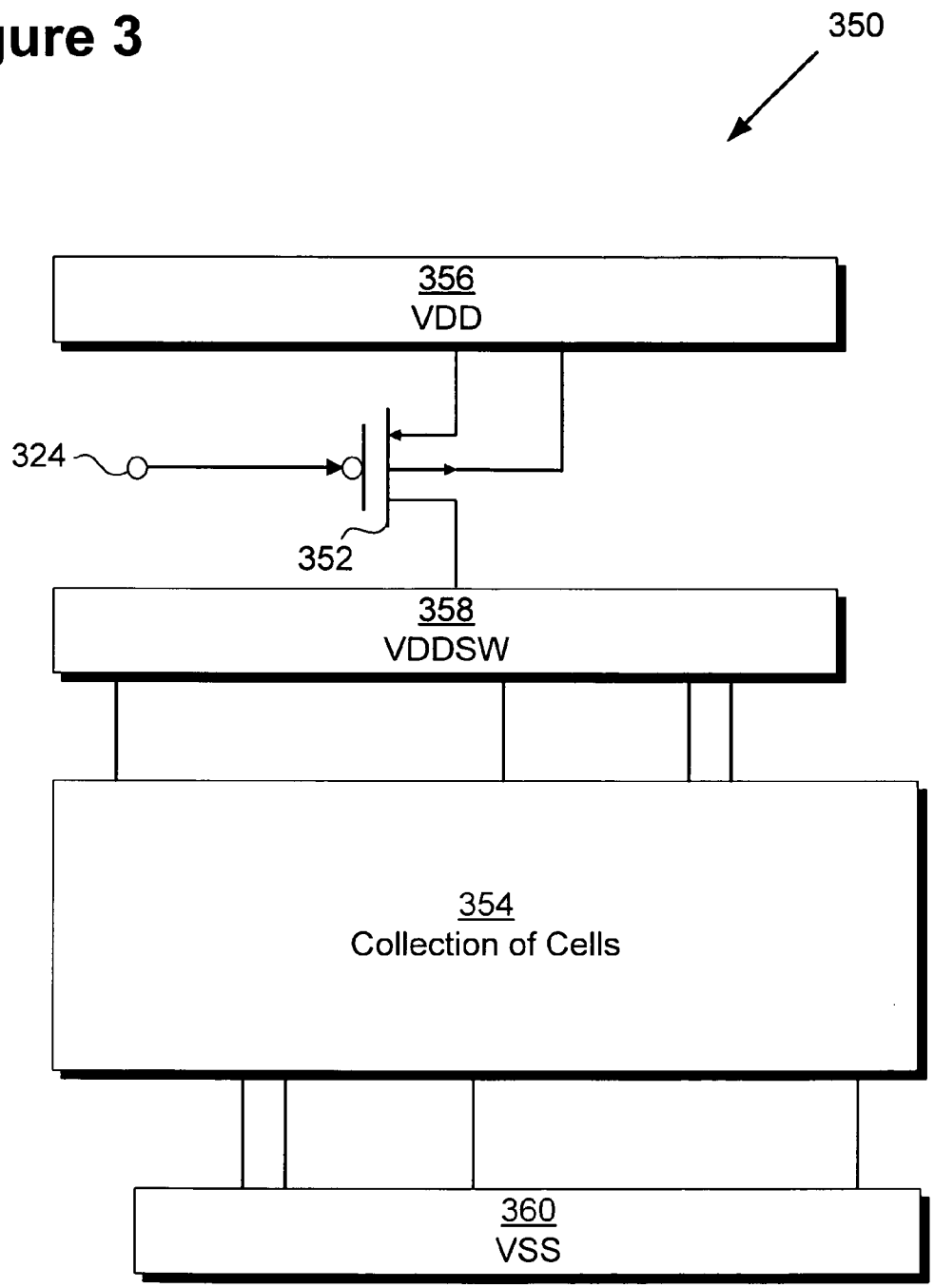
FIG. 3 shows a switched-power cell grouping in accordance with one embodiment of the present invention.

An embodiment of switched-power cell grouping 250 is illustrated in greater detail in FIG. 3 as switched-power cell grouping 350. Switched-power cell grouping 350 is an exemplary circuit to selectively switch the inrush current flowing into a high-current circuit block, such as high-current circuit block 240, in FIG. 2. As shown in FIG. 3, switched-power cell grouping 350 may include VDD voltage rail 356, VSS voltage rail 360 and VDDSW voltage rail 358. These three voltage rails may be integrated into a semiconductor die or package. For example, VDD voltage rail 356, VSS voltage rail 360 and VDDSW voltage rail 358 may correspond to metal rails on a die or package. VDD voltage rail 356, VSS voltage rail 360 and VDDSW voltage rail 358 may form a metal grid or other pattern known in the art.

Switched-power cell grouping 350 may include a power gate, such as P type metal-oxide semiconductor ("PMOS") header switch 352. As illustrated in FIG. 3, PMOS header switch 352 has its source and substrate connected to VDD voltage rail 356, its drain connected to VDDSW voltage rail 358, and its gate connected to enable input 324, which is a control input. Semiconductor vias (not shown in FIG. 3) may connect PMOS header switch 352 to VDD voltage rail 356. PMOS header switch 352 may also incorporate a well tie (not shown in FIG. 3) and a substrate tie (also not shown in FIG. 3), which connect PMOS header switch 352 to respective voltage rails while reducing the semiconductor ties in other regions of switched-power cell 350. Enable input 324 may correspond to one of the metal layers that connect digital control circuit 222 to switched-power cell grouping 250 in FIG. 2. For example, enable input 324 may transmit initial column signal 224 in FIG. 2.

Alternatively, an embodiment of the present invention may include an N type metal-oxide semiconductor ("NMOS") footer switch connected between a low voltage rail, such as VSS voltage rail 360, and an intermediate voltage rail, such as a voltage step-up analogue to VDDSW voltage rail 358, for example. A collection of cells may be connected between a high voltage rail and the intermediate voltage rail. This alternative embodiment is not illustrated for the purpose of brevity.

Returning to FIG. 3, switched-power cell grouping 350 may also include collection of cells 354. Collection of cells 354 may comprise individual devices, cells or groups of cells within a high-current circuit block, such as high-current circuit block 240, in FIG. 2. Collection of cells 354 may reside between VSS voltage rail 360 and VDDSW voltage rail 358.

As illustrated in FIG. 3, an enable signal may be supplied through enable input 324 to the gate of PMOS header switch 352, causing PMOS header switch 352 to conduct. The resulting current path between VDD voltage rail 356 and VDDSW voltage rail 358 will raise the voltage of VDDSW voltage rail 358 from the voltage of VSS voltage rail 360 to a voltage near the voltage of VDD voltage rail 356. This current path allows switching on and off of the individual devices, cells or groups of cells within collection of cells 354.

Figure 4:
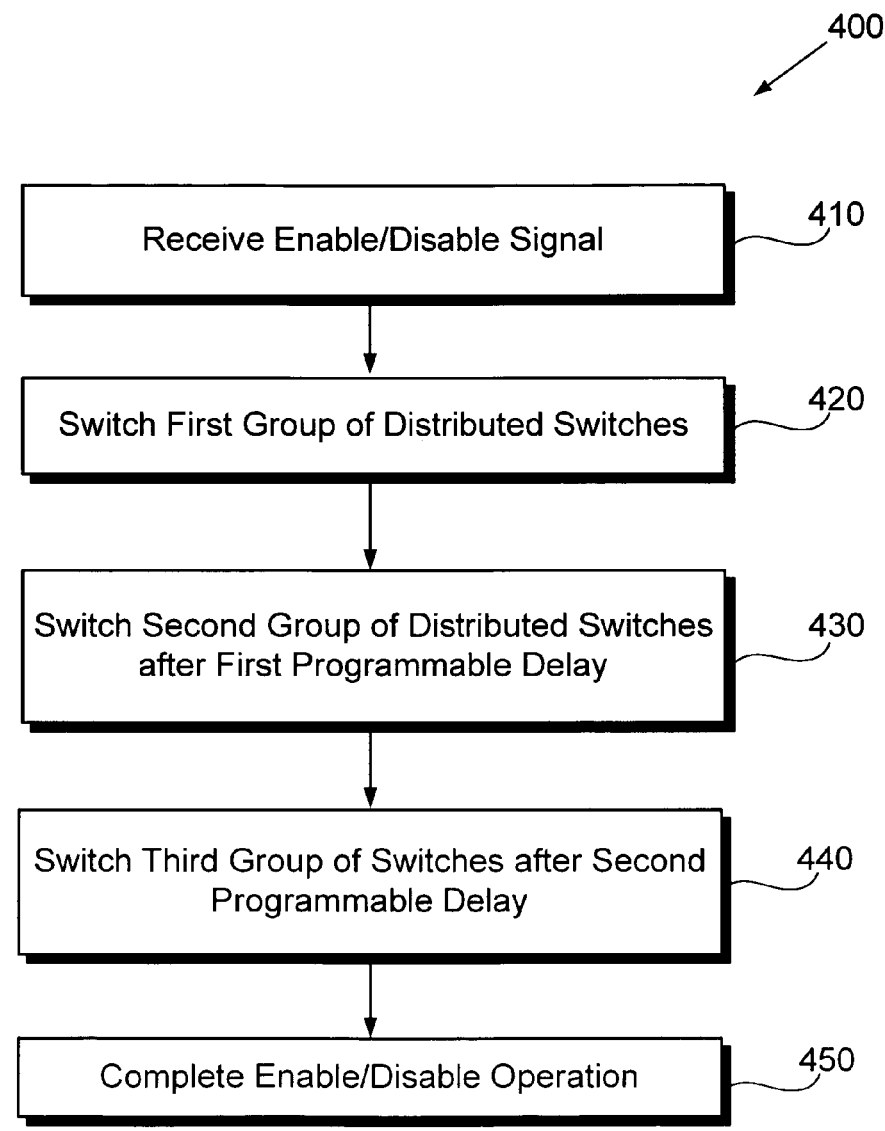
FIG. 4 is a flowchart presenting a method for controlling inrush current by an inrush current control circuit according to one embodiment of the present invention.

The exemplary embodiments of an inrush current control circuit illustrated in FIG. 1 through FIG. 3 will be further described by reference to flowchart 400 in FIG. 4, which describes the steps, according to one embodiment of the present invention, of a method for use by an inrush current control circuit. It is noted that certain details and features have been left out of flowchart 400 that are apparent to a person of ordinary skill in the art. For example, a step may comprise one or more substeps as known in the art. While steps 410 through 450 indicated in flowchart 400 are sufficient to describe one embodiment of the present invention, other embodiments of the invention may utilize steps different from those shown in flowchart 400.

Beginning with step 410 of flowchart 400, and referring to FIG. 2, step 410 of flowchart 400 comprises receiving an enable/disable signal. As shown in FIG. 2, digital control circuit 222 may receive Wake-up signal 222a. Wake-up signal 222a may originate within inrush current control circuit 220 or may be externally inputted. Wake-up signal 222a may indicate that high-current circuit block 240 of switched-power block 230 should change from an inactive state to an active state, for example. Conversely, digital control circuit 222 may receive a disable signal such as Power Down signal 222b, which may originate either within or be externally inputted. Power Down signal 222b may indicate that high-current circuit block 240 of switched-power block 230 should change from an active state to an inactive state.

Continuing to step 420 of flowchart 400, step 420 comprises switching a first group of distributed switches. As shown in FIG. 2, digital control circuit 222 may begin step 420 by sending a control signal, for example, initial column signal 224, to switched-power block 230. Switched-power block 230 could be configured to switch a first group of switched-power cells, including for example major cell group 272, which is shown in FIG. 2 to further include switched-power cell grouping 250.

The switching of a first group of switched-power cells could depend on the distribution of these cells and the manner in which inrush current is to be controlled. For example, the first group of switched-power cells could be spread uniformly across the high-circuit block (illustrated by major cell group 272) to provide a small and relatively uniform flow of initial current. Alternatively, the first group of switched-power cells could be concentrated in localized pockets (not shown in FIG. 2) to mitigate inrush current spikes due to localized circuit elements.

Continuing to step 430 of flowchart 400, step 430 comprises switching a second group of distributed switches after a first programmable delay. A first programmable delay may comprise a time interval X, for example. The time interval X may be input into digital control circuit 222 through X-Delay signal 222d, which in turn may originate inside inrush current control circuit 220 or be externally inputted. After the first programmable delay interval, digital control circuit 222 may transmit X-column signal 226 to switched-power block 230.

Switched-power block 230 may then activate a second group of switched-power cells, for instance minor cell group 274. The duration of the first programmable delay may be adjusted to regulate inrush current according to a desired control method. For example, the first programmable delay could be adapted to the amount of time that the internal capacitances of the high-current circuit block take to absorb the current initially allowed when major cell group 272 was activated. The first programmable delay may be based on simulated or predicted parameters of transistors, diodes and other devices within switched-power block 230. As with the first group of switched-power cells, the second group of switched-power cells may be distributed uniformly (illustrated by minor cell group 274) or in localized patterns depending on the manner used to control inrush current.

Turning to step 440 of flowchart 400, step 440 comprises switching a third group of distributed switches after a second programmable delay. A second programmable delay may comprise a time interval Y, for example, which, as shown in FIG. 2, may be input into digital control circuit 222 through Y-Delay signal 222e. Y-Delay signal 222e may originate within inrush current control circuit 220 or be externally inputted. After the second delay, digital control circuit 222 may conduct Y-column signal 228 to switched-power block 230. In some embodiments of the present invention, it is contemplated that the first and second programmable delays, e.g. respective time intervals X and Y in the present example embodiment, are not equal to one another.

Switched-power block 230 may then activate a third group of switched-power cells (not explicitly indicated in FIG. 2). Like the first programmable delay, the second to programmable delay may be adjusted to further regulate inrush current according to a desired control method and may be adjusted to accommodate device parameters within switched-power block 230. Embodiments of the present invention may add groups of distributed switches and programmable delays without departing from the present invention.

Turning to step 450 of flowchart 400, step 450 comprises completing the enable/disable operation. After all switched-power cells in switched-power block 230 are turned on, high-current circuit block 240 of switched-power block 230 has approached or reached a steady state. Consequently, the inrush current in the high-current circuit block need not be further regulated until the state of the high-current circuit block is changed to another state—that is—activated or inactivated in a subsequent enable/disable operation. Consistent with step 450, digital control circuit 222 may return Power Ok signal 222c after substantially all switched-power cells in high-current circuit block 240 are on. Power Ok signal 222c may be transmitted to a point within inrush current control system 220 or may be transmitted to an external point. Alternatively, if the high-current circuit block is in an inactive state, the present invention may include preventing crowbar currents from passing from the high-current circuit block.

Figure 5:
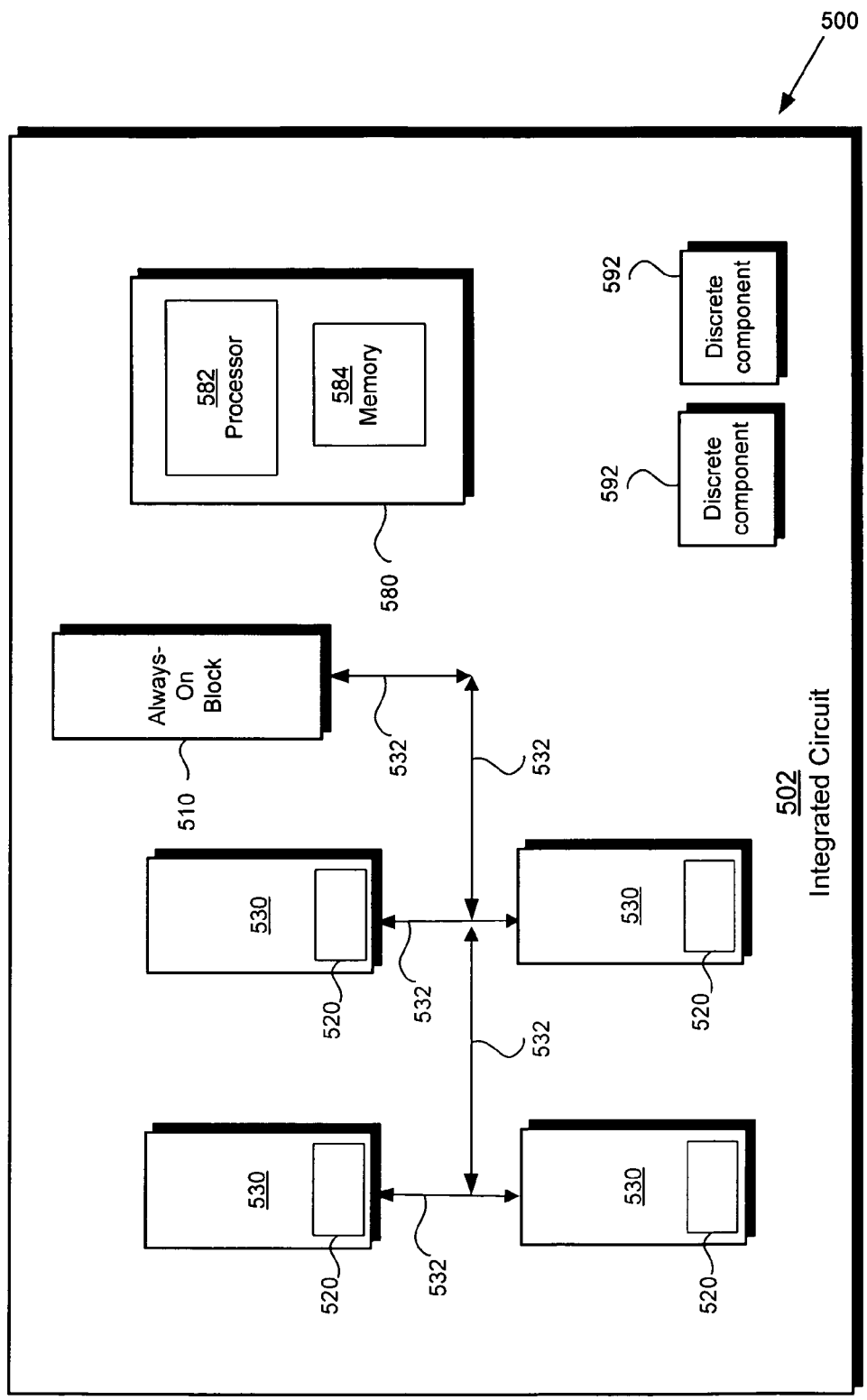
FIG. 5 shows a system-on-a-chip, which incorporates an embodiment of the present invention.

FIG. 5 illustrates system-on-a-chip 500, which comprises exemplary integrated circuit (IC) 502 including an embodiment of the present invention. As illustrated, IC 502 may contain central processing unit 580, which in turn may contain processor 582 and memory 584. Discrete components 592 may also be packaged on IC 502. Buses 532 may connect a plurality of switched-power blocks 530 to always-on block 510. In this embodiment, always-on block 510 may contain clock and master control circuitry, while each of switched-power circuit blocks 530 includes an embodiment of inrush current control circuit 520.

Always-on block 510, inrush control circuit 520, and switched-power block 530 generally correspond to respective always-on block 110, inrush control circuit 120, and switched-power block 130, in FIG. 1. However, unlike the embodiment shown in FIG. 1, as well as those shown in FIG. 2 and FIG. 3, according to the embodiment shown in FIG. 5, inrush current control circuit 520 may reside within switched-power blocks 530 and may control the inrush current into the switched power cells of switched-power block 530 consistent with the present invention. All of the illustrated components may be packaged on the same die or substrate, for example, and may be configured to effectively control inrush current control in one or more high-current circuit blocks.

Thus, the present application discloses a novel and inventive solution for controlling inrush current. By initially activating a first group of switched-power cells in response to an enable/disable signal, embodiments of the present invention avoid the initial spikes in inrush current often seen in the conventional art. In addition, by activating one or more additional switched-power cell groupings after additional corresponding programmable delay intervals, the present inventive concepts enable both efficient performance of an enable/disable operation and control of inrush current throughout that operation. Moreover, the disclosed solution is advantageously compatible with existing semiconductor manufacturing and packaging technology.

From the above description of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A current control circuit for controlling and regulating current into a high-current circuit block, comprising:
   a plurality of switched-power cells disposed in the high-current circuit block, each of the plurality of switched-power cells including
   a high-current circuit, and
   a switch configured to connect the high-current circuit to a power source; and
   a digital control circuit coupled to each switch of the plurality of switched-power cells and configured to:
   turn on switches of a first group of said plurality of switched-power cells in response to an enable/disable signal to power the first group of the switched-power cells, and
   turn on switches of a second group of switched-power cells after a first programmable delay to power the second group of the switched-power cells,
   wherein at least one switched-power cell of the second group of switched power cells is situated between two switched power cells of the first group of switched-power cells.

2. The current control circuit of claim 1, wherein said current control circuit is configured to activate a state of said high-current circuit block.

3. The current control circuit of claim 1, wherein said digital control circuit is further configured to turn on switches of a third group of switched-power cells after a second programmable delay to power the third group of switched-power cells to the power source.

4. The current control circuit of claim 3, wherein said first programmable delay is not equal to said second programmable delay.

5. The current control circuit of claim 1, wherein said digital control circuit further comprises at least one isolation cell to prevent a crowbar current from flowing between said current control circuit and said high-current circuit block.

6. The inrush current control circuit of claim 1, wherein each of the first group of switched-power cells is laid out in a different column of switched-power cells than switched-power cells of the second group of switched power cells.

7. The current control circuit of claim 1, wherein said current control circuit is configured to deliver an analog voltage to the switch in each of the plurality of switched-power cells.

8. The current control circuit of claim 1, wherein the switch in each of said plurality of switched-power cells comprises a power gate.

9. The current control circuit of claim 1, wherein the switch in each of said plurality of switched-power cells comprises a P type metal-oxide semiconductor ("PMOS") header transistor.

10. The current control circuit of claim 9, further comprising a well tie connecting a well of said PMOS header transistor to a power supply.

11. The current control circuit of claim 1, further comprising a substrate tie connecting a substrate of said current control circuit to the power source.

12. The current control circuit of claim 1, wherein said current control circuit and said high-current circuit block are situated on one semiconductor die.

13. A method for use by a current control circuit for regulating a flow of current in a high-current circuit block including switched-power cells, comprising:
    turning on switches of a first group of switched-power cells by a digital control circuit of said current control circuit and in response to an enable/disable signal, to power the first group of switched-power cells, the switches of the first group of switched-power cells connecting the first group of switched-power cells to a power source; and
    turning on switches of a second group of switched power cells by said digital control circuit after a first programmable delay to regulate flow of the current, the switches of the second group of switched-power cells connecting the second group of switched-power cells to the power source;
    wherein at least one switched-power cell of the second group of switched-power cells is situated between two switched-power cells of the first group of switched-power cells.

14. The method of claim 13, further comprising turning on switches of a third group of switched-power cells by said digital control circuit after a second programmable delay, the switches of the third group of switched-power cells connecting the third group of switched-power cells to the power source.

15. The method of claim 13, further comprising changing a state of said high-current circuit block.

16. The method of claim 13, further comprising preventing a crowbar current from passing from said high-current circuit block.

17. A current control circuit for activating a high-current circuit block, comprising:
    a plurality of switched-power cells included in the high-current circuit block, each of the plurality of switched-power cells including
        a high-current circuit, and
        a switch configured to connect the high-current circuit to a power source; and
    a digital control circuit coupled to the switch of each of the plurality of switched-power cells and configured to:
        turn on switches of a first group of the switched-power cells in response to an enable/disable signal to power the first group of the switched-power cells,
        turn on switches of a second group of the switched-power cells after a first programmable delay to power the second group of the switched-power cells, and
        turn on switches of a third group of the switched-power cells after a second programmable delay to power the third group of the switched-power cells,
    wherein at least one switched-power cell of the second group of switched power cells is situated between two switched power cells of the first group of switched-power cells.

18. The current control circuit of claim 17, wherein the switch of each of the plurality of switched-power cells comprises a P type metal-oxide semiconductor ("PMOS") header transistor.

19. The current control circuit of claim 18, further comprising a well tie connecting a well of said PMOS transistor to the power source.

20. The current control circuit of claim 17, wherein said digital control circuit further comprises at least one isolation cell to prevent a crowbar current from flowing between said current control circuit and said high-current circuit block.

* * * * *